United States Patent
Zelley

(10) Patent No.: US 7,103,328 B2
(45) Date of Patent: Sep. 5, 2006

(54) POWER TRANSFER MEASUREMENT CIRCUIT FOR WIRELESS SYSTEMS

(75) Inventor: Christopher A. Zelley, Worcester (GB)

(73) Assignee: SiGe Semiconductor Inc., Ottawa (CA)

( * ) Notice: Subject to any disclaimer, the term of this patent is extended or adjusted under 35 U.S.C. 154(b) by 419 days.

(21) Appl. No.: 10/625,606

(22) Filed: Jul. 24, 2003

(65) Prior Publication Data

US 2005/0020218 A1 Jan. 27, 2005

(51) Int. Cl.
*H04B 17/00* (2006.01)

(52) U.S. Cl. .............................. 455/115.3; 455/115.1; 455/115.4

(58) Field of Classification Search ................ 455/115, 455/127.1, 129, 115.1–4
See application file for complete search history.

(56) References Cited

U.S. PATENT DOCUMENTS

| | | | |
|---|---|---|---|
| 4,290,009 A | 9/1981 | Sanpei et al. | |
| 4,547,728 A * | 10/1985 | Mecklenburg | 324/95 |
| 4,721,901 A | 1/1988 | Ashley | |
| 6,157,253 A * | 12/2000 | Sigmon et al. | 330/10 |
| 6,566,848 B1 * | 5/2003 | Horigan et al. | 323/283 |
| 6,873,608 B1 * | 3/2005 | Plotnik et al. | 370/328 |
| 2002/0113600 A1 * | 8/2002 | Swank, II | 324/637 |
| 2002/0113601 A1 * | 8/2002 | Swank, II | 324/637 |

\* cited by examiner

*Primary Examiner*—Quochien B. Vuong
*Assistant Examiner*—Christian A. Hannon
(74) *Attorney, Agent, or Firm*—Kenyon & Kenyon LLP

(57) ABSTRACT

The purpose of the invention is to provide an accurate measurement of RF signal power transfer between a power amplifier circuit and an antenna in the presence of supply voltage variations, temperature variations and VSWR mismatch. Knowing the VSWR mismatch enables modification of a control loop for the PA and thus allows for output power adjustment in order to make the PA more efficient and robust against VSWR changes. Having an indication of power delivered to the load and the VSWR is desirable for many wireless applications especially in those applications where the PA can generate emissions that are out of band and all emissions subject to industry standards. In particular, the embodiments of the invention are applicable to wireless LANs (WLANs).

24 Claims, 2 Drawing Sheets

POWER TRANSFER MEASUREMENT CIRCUIT FOR WIRELESS SYSTEMS

FIELD OF THE INVENTION

This invention relates to the field of measuring of output signal power and more specifically to the area of measuring of output signal power for wireless systems in the presence of supply voltage variations, temperature variations, and voltage standing wave ratio (VSWR) mismatch.

BACKGROUND OF THE INVENTION

In wireless systems, power amplifier circuits (PAs) are used to amplify a RF input signal prior to providing an amplified RF output signal to a load. In delivering of RF power from the PA to a load coupled thereto, an impedance match between the PA, feedline circuit, and the load is important in order to facilitate maximum power transfer therebetween. Any portion of the signal provided to the load that is not transferred reflects back into an output port of the PA and results in the PA producing unwanted signal emissions and lower efficiency. For wireless appliances, the FCC imposes strict radiation emission standards. If a wireless device does not fall within these standards, then such a wireless device is not salable, since broadcasting of RF signals outside a designated frequency band for the wireless devices is known to cause interference to surrounding electrical devices.

Furthermore, if the amplified RF output signal reflects back from the load, then less than a maximum transfer of RF signal power occurs and this results in unnecessary energy consumption by the PA. In addition to reduced power efficiency, amplified signals reflected back into the PA can damage the PA as relatively high voltages build on the output terminals of the circuit. The reflected signal is, effectively, energy that is not transferred from the PA to the load. Rather, this energy can be absorbed by the PA circuit resulting in a rise in junction temperatures concomitant with the loss of net power amplifier efficiency.

A Voltage Standing Wave Ratio (VSWR) is an indicator that is used with RF antenna systems to measure the coupling efficiency between the PA output port and an antenna. Typically, most antennas are not directly connected to a PA. The antenna is usually located some distance from the transmitter and PA and uses a feedline to transfer power therebetween. If the feedline has no loss and is impedance matched to both the PA output impedance and the antenna input impedance then maximum RF signal power is delivered to the antenna. In this case the VSWR is 1:1 and the voltage and current are constant over the whole length of the feedline. Any deviation from this situation causes a "standing wave" of voltage and current to exist on the feedline therebetween. This standing wave results in wasted energy and thus leads to wireless system inefficiencies.

Various techniques for measuring of RF signal power transfer between a PA output port and a load coupled thereto are known to those of skill in the art. For example, voltage sensing is performed at a final power amplification stage of the PA. Typically, a peak voltage detection scheme is utilized and it is therefore directly affected by a VSWR mismatch error. Unfortunately, with this technique, no indication of a level of VSWR mismatch is provided because the rise in peak voltage can be attributed to an increase in output power from the PA or a change in the VSWR. In effect, the peak voltage detection scheme can be ambiguous since voltage is not indicative of power transferred.

Another technique for measuring of RF signal power transfer utilizes voltage sensing at a penultimate stage of the PA. Unfortunately, this technique implements a peak voltage detection scheme and is therefore directly affected by VSWR mismatch error. Due to buffering of a final amplification stage of the PA, errors in the VSWR measurement are reduced. A disadvantage however, is that the final amplification stage is typically outside a control loop of the PA. Thus, the RF output signal is typically susceptible to supply voltage and temperature changes in the final amplification stage of the PA. Additionally, with this technique, there is no indication of VSWR mismatch provided.

A third technique for measuring of RF signal power transfer, which is known to those of skill in the art, is to provide the RF output signal through an off-chip directional coupler for forming a coupled signal. The coupled signal is connected to a detector circuit, which is usually a diode. Unfortunately, this approach has a number of off-chip components and often the detectors used for such an approach do not have the temperature stability of on-chip detectors.

Measuring of the VSWR is advantageous in that an amount of amplified RF signal power that is not coupled to the load is known and thus corrections to vary the RF output signal power are performable as a result thereof. A need therefore exists for measuring of power coupling between a PA output port and a load in the presence of supply voltage variations, temperature variations, and VSWR mismatch. It is therefore an object of the invention to provide a method and system of measuring power coupling between a circuit for emitting an amplified RF signal and a load coupled thereto.

SUMMARY OF THE INVENTION

In accordance with the invention there is provided a circuit for measuring power transfer between a first node and a second node comprising: a coupler circuit comprising: a first port directly connected to the first node for receiving a RF output signal and a second port directly connected to the second node for providing the RF output signal therefrom, the first transmission line for propagating the RF output signal between the first port and the second port, a third port and a fourth port, the fourth port for providing a first signal indicative of forward propagating RF energy propagating from the first port to the second port and the third port for providing a second signal indicative of backwards propagating RF energy propagating from the second port to the first port; and, detection circuitry comprising: a first input port coupled to the third port for receiving the first signal indicative of forward propagating RF energy; a second input port coupled to the fourth port for receiving the signal indicative of backwards propagating RF energy; a first detected energy output signal port for providing a first detected energy output signal; and, a second detected energy output signal port for providing a second detected energy output signal.

In accordance with the invention there is provided a method of measuring power transfer between a power amplifier circuit for emitting a RF output signal and a first load for receiving the RF output signal comprising the steps of: providing a coupling circuit having a main signal path and a coupled signal path, the main signal path disposed between the power amplifier circuit and the first load; propagating a RF output signal along the main signal path to the first load; coupling forward propagating RF energy and backward propagating RF energy into the coupled signal path; detecting the forward propagating RF energy to form a first detected energy output signal; detecting the backward propagating RF energy to form a second detected energy output signal; and, providing two detected output signals, a first detected signal relating to the forward propagating RF energy and a second detected signal relating to the backward propagating RF energy.

BRIEF DESCRIPTION OF THE DRAWINGS

The invention will now be described with reference to the drawings in which.

DETAILED DESCRIPTION OF THE INVENTION

Figure 1:
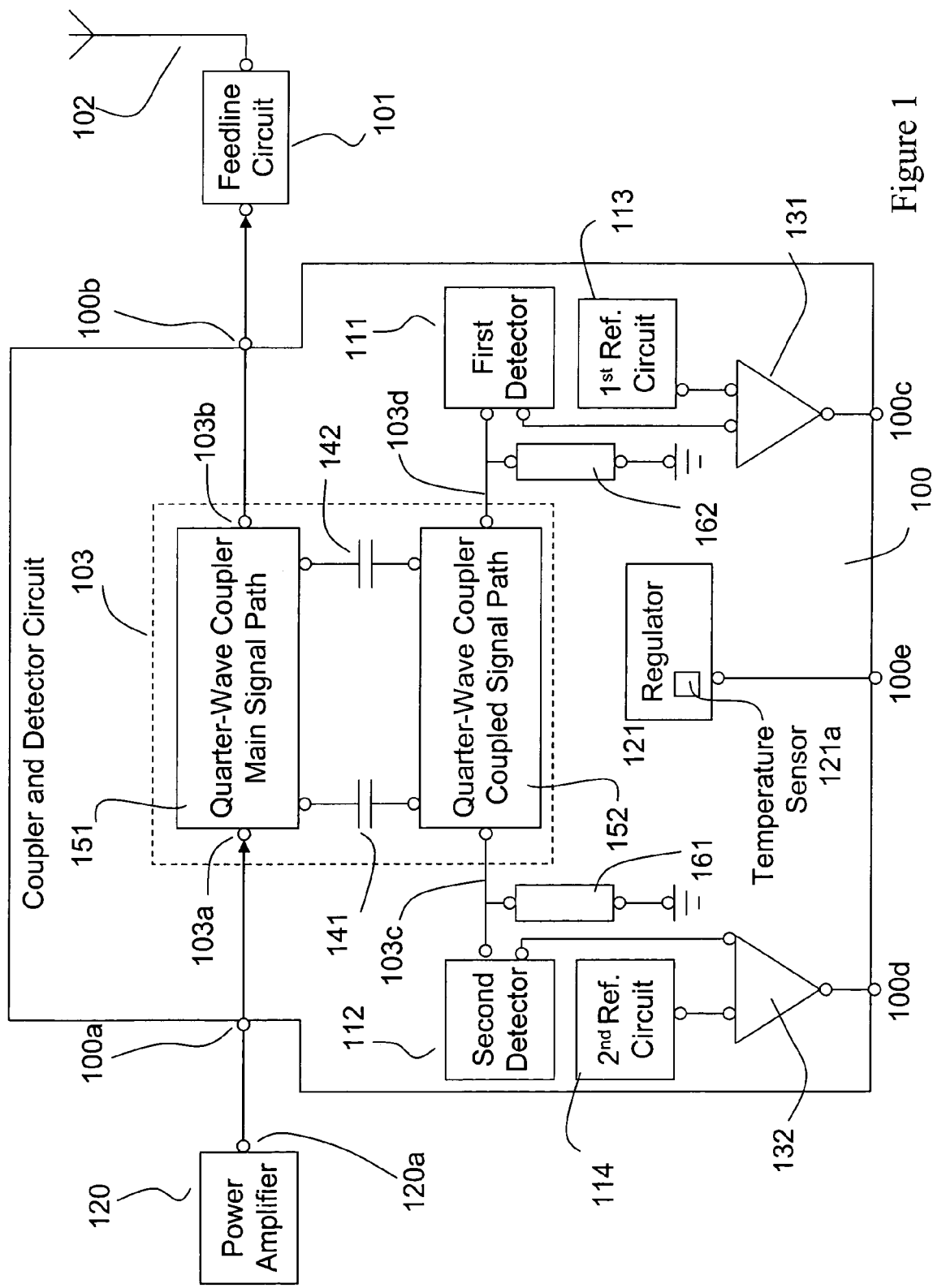
FIG. 1 illustrates a coupler and detector circuit having an internal main signal path and an internal coupled signal path in accordance with a first embodiment of the invention; and, FIG. 2 illustrates a coupler and detector circuit having an external main signal path and an internal coupled signal path in accordance with a second embodiment of the invention.

FIG. 1 illustrates a coupler and detector circuit (CDC) 100 having an internal signal path, in accordance with a first embodiment of the invention. A power amplifier (PA) circuit 120 is disposed for providing an amplified RF output signal via an output port thereof 120a to a first node 100a of the CDC 100. Within the CDC the amplified RF output signal propagates through a RF coupler, in the form of a quarter wave coupler circuit 103, from a first port thereof 103a to a second port thereof 103b, along a main signal path 151, disposed between a first node 100a directly connected to the PA output port 120a, and a second node 100b directly connected, at an input of the feedline circuit 101. The feedline circuit 101 is disposed between a RF antenna 102 and the second node 100b of the CDC 100, where the antenna 102 is used to broadcast the amplified RF output signal. The second port 103b of the quarter wave coupler is directly connected to the second node 100b of the CDC 100. The energy of the amplified RF output signal broadcast by the antenna is dependent upon an impedance transformation along the feedline circuit 101 and main signal path between the first node 100a and the second node 100b. If the impedance transformation along the feedline circuit and main signal path is one that allows for maximum power transfer from the PA output port 120a to the antenna 102, then maximum power transfer occurs therebetween and the VSWR ratio is 1:1 with the voltage and current being substantially constant over this length. Any deviation from the VSWR ratio of 1:1 situation, resulting from improper impedance matching along the feedline circuit 101 and main signal path 151, causes a "standing wave" of voltage and current, having peaks and troughs, to exist therealong.

In this embodiment, the quarter wave coupler 103 is manufactured within a same die as the CDC 100 as either a distributed quarter wave coupler or lumped quarter wave coupler. Alternatively, another form of quarter wave coupler is envisioned. The manufacturing technique implemented for manufacturing of this quarter wave coupler 103 is dependent upon the frequency of the amplified RF signal, integrated circuit process, and geometry of the coupler. For lower frequency RF signals, the quarter wave coupler is typically implemented using lumped components, where a quarter of a wavelength results in a physically large size and thus integration thereof becomes expensive. For higher frequencies, transmission line or distributed structures are typically utilized. A quarter wave coupler in the form of an edge coupler is also useable.

Under proper impedance transforming conditions, the feedline 101 and main signal path 151 only propagate forward propagating RF energy, propagating from the PA 120 to the antenna 102. Under mismatched conditions there is a backreflection of RF energy at the antenna 102, so a portion of the RF signal, the backward-propagating RF energy, propagates from the antenna 102 and along the feedline circuit 101 and the main signal path 151 to the PA 120 output port 120a. These forward and backward propagating RF energies interact to form a standing wave along the feedline 101 and main signal path 151, a quality of which is indicated by the VSWR. Conventional means for measuring the RF signal power of this standing wave, having peaks and troughs using voltage detection, provides a misleading VSWR measurement. VSWR measurement is known to be phase dependent and in performing of this measurement, it is unknown whether the measurement is being performed at a peak or in a trough of the standing wave.

The quarter wave coupler circuit 103, in conjunction with associated circuitry, described hereinbelow, is used to measure the VSWR in such a manner that prior knowledge of the phase of the RF signal propagating along the feedline circuit 101 and main signal path 151 is not utilized. The function of the quarter wave coupler circuit 103 is to couple RF signal energy, from the forward propagating RF energy and backward propagating RF energy, along the main signal path 151 into a coupled signal path 152. To those of skill in the art it is known that a quarter wave coupler 103 has a property, where, RF energy entering at the first port 103a appears at the second port 103b and a fourth port 103d, but not at a third port 103c. Likewise, RF energy entering the quarter wave coupler 103 at the second port 103b appears at the first port 130a and the third port 103c, but not at the fourth port 103d. Thus, the third port 103c provides a signal indicative of backwards propagating RF energy and the fourth port 103d provides a signal indicative of forward propagating RF energy. The main signal path 151 of the quarter wave coupler 103 is disposed between ports 103a and 103b. A coupled signal path 152 of the quarter wave coupler is disposed between ports 103c and 103d. Coupling between the main signal path 151 and the coupled signal path 152, and hence the ports of the quarter wave coupler 103, is achieved using a first coupling capacitor 141 and a second coupling capacitor 142. Preferably, the first and second coupling capacitors are small value capacitors.

A second detector circuit 112, coupled to the third port 103c of the quarter wave coupler circuit 103, is disposed for receiving of a second signal indicative of backwards propagating RF energy to form a second intermediate detected signal. A first detector circuit 111, coupled to the fourth port 103d of the quarter wave coupler circuit 103, is disposed for receiving of a first signal indicative of forward propagating RF energy to form a first intermediate detected signal. A second difference amplifier 132 is disposed for receiving the second intermediate detected signal and a second reference signal emitted from an output port of a second reference circuit 114 in the form of a detector circuit. A first difference amplifier 131 is disposed for receiving the first intermediate detected signal and a first reference signal emitted from an output port of a first reference circuit 113 in the form of a detector circuit. The first difference amplifier 131 has an output port thereof coupled to a first output port 100c for providing a first detected energy output signal, which is indicative of the forward-propagating RF energy. The second difference amplifier 132 has an output port thereof coupled to a second output port 100d for providing a second detected energy output signal, which is indicative of the backward-propagating RF energy.

Thus, the level of the VSWR is therefore determined by measuring the level of the backwards-propagating RF energy as detected by the second circuit 112. For an impedance transformation that allows for maximum power transfer between the PA output port 120a and the antenna 102, the second detected energy output signal is substantially zero and first detected energy output signal is substantially maximized, otherwise, for an impedance transformation that allows for other than maximum power transfer, the second detected energy output signal is substantially other than zero and the first detected energy output signal is substantially other than maximized. The reference circuits 113 and 114 provide first and second reference signals to the first and second difference amplifiers 131 and 132 so that voltage offsets are subtracted from the first and second intermediate detected signals. These reference circuits 113 and 114 serve to decrease systematic errors and to reduce pedestals in the first and second detected energy output signals. The first and second difference amplifiers 131 and 132 perform signal subtraction, where these difference amplifiers are optionally in the form of operational amplifiers.

Preferably, first and second detector circuits, as well as the first and second reference circuits, are disposed within a same substrate as the remainder of the CDC 100 along with a regulator circuit 121. A supply voltage input port 100e, for receiving a supply voltage from a voltage source (not shown), is coupled to the regulator circuit 121. Further preferably, the regulator circuit 121 includes a temperature sensing circuit 121 a for sensing a temperature of a die forming the CDC 100. The regulator circuit 121 is for providing a regulated supply voltage to the two detector circuits, to the two reference circuits, and to the difference amplifiers. The regulated supply voltage thus provides reduced temperature sensitivity and increased supply voltage fluctuation immunity for the CDC 100. Further preferably, the quarter wave coupler circuit is also disposed within a same semiconductor substrate as the detector circuits, 111 through 112, the reference circuits 113 and 114, and the regulator circuit 121. Additionally, a first impedance 161 is disposed between the third port 103c and a ground potential and a second impedance 162 is disposed between the fourth port 103d and the ground potential.

Figure 2:
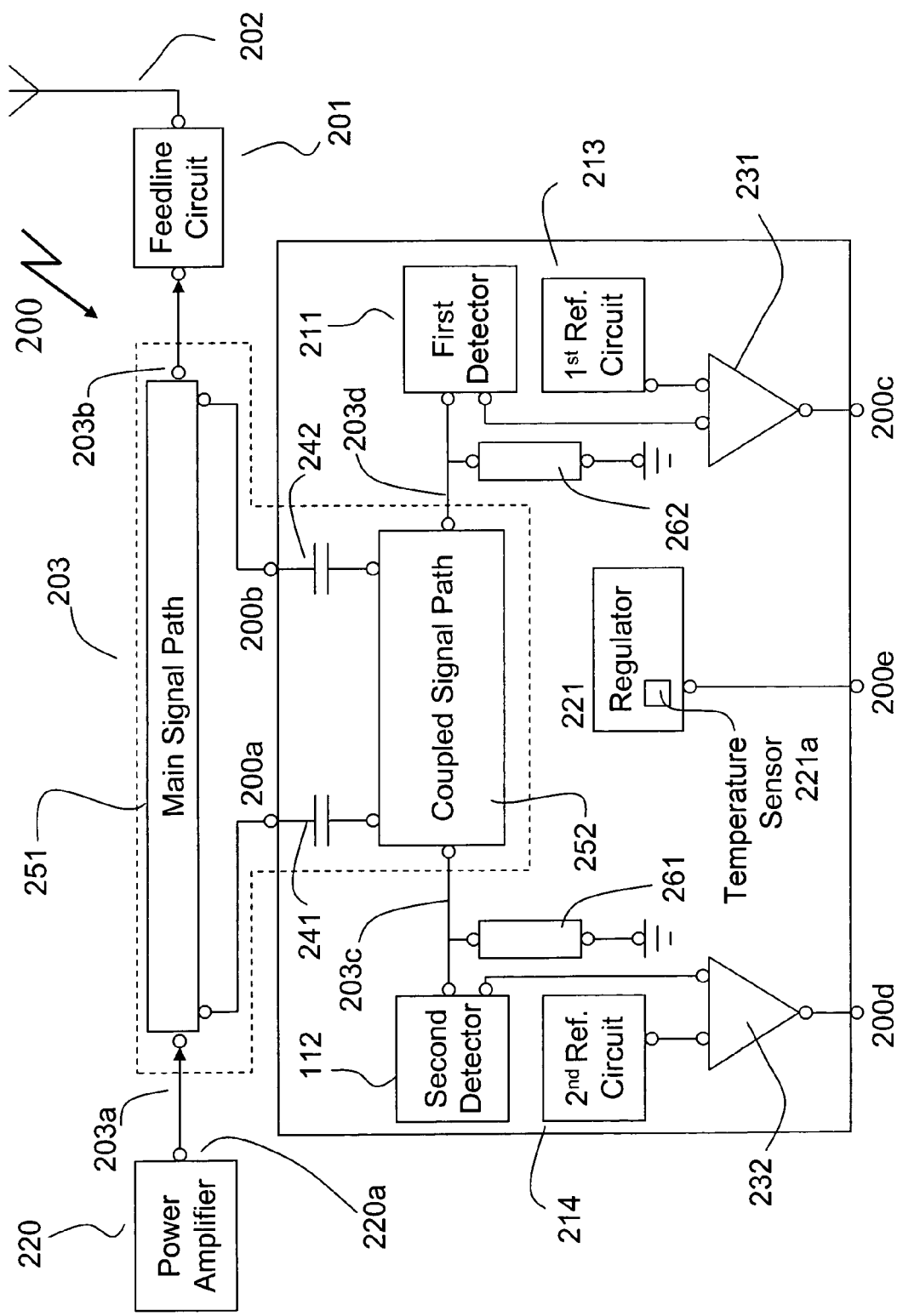

FIG. 2 illustrates a coupler and detector circuit (CDC) 200 having an external signal path, in accordance with a second embodiment of the invention. The external signal path, in the form of a main signal path 251, is not disposed on a same semiconductor die as the CDC 200. The main signal path 251 is preferably in the form of a PCB trace, with a first coupling capacitor 241 and a second coupling capacitor 242 disposed between the main signal path and a coupled signal path 252. The off-chip main signal path 251 and the on-chip coupled signal path form the coupler circuit, in the form of a quarter wave coupler circuit 203. Disposed on opposing ends of the main signal path are a first node 203a and a second node 203b. A power amplifier (PA) circuit 220 provides an amplified RF output signal via an output port thereof 220a to the first node 203a of the CDC 100. The amplified RF output signal propagates through the main signal path 251 to the second node 203b. The second node 203b is directly connected in series with a feedline circuit 201 and an input port of a RF antenna 102. The RF antenna 202 is used to broadcast the amplified RF output signal. Of course, energy of the amplified RF output signal broadcast by the antenna is dependent upon an impedance transformation along the feedline circuit 201 and the main signal path 251 formed between the PA output port 220a and the input port of the antenna 202. If the impedance transformation along the feedline circuit 201 and the main signal path 251 is such that maximum power transfer occurs therealong, then a VSWR ratio of 1:1 is obtained. During maximum power transfer, VSWR ratio of 1:1 is obtained along the feedline circuit 251 and main signal path 201, where voltage and current are substantially constant. Any deviation from this state, such as when the antenna 202 is disconnected or places in proximity of a metal surface, results in an improper impedance transformation to occur along the feedline circuit and main signal path and a "standing wave" of voltage and current, having peaks and troughs, forms therealong.

Under properly impedance matched conditions, the RF signal path along the feedline circuit 201 and main signal path 251 only propagates forward propagating RF energy, propagating from the PA 220 to the antenna 202. Under mismatched conditions there is a reflection of RF energy at the antenna 202, so a portion of the RF signal, the backward-propagating RF energy, propagates from the antenna 202 to the PA input port 220a. These forward propagating and backward propagating RF energies interact to form a standing wave along the feedline 201 and main signal path 251, a quality of which is indicated by the VSWR. Conventional means of measuring the RF signal power of this standing wave having peaks and troughs using voltage detection provide a misleading measurement. VSWR measurement is phase dependent and in performing of this measurement, it is unknown whether the measurement is being performed at a peak or in a trough of the standing wave.

The quarter wave coupler circuit 203, in conjunction with associated circuitry, described hereinbelow, is used to measure the VSWR in such a manner that prior knowledge of the phase of the RF signal along the feedline is not required. The function of the quarter wave coupler circuit 203 is to couple a portion of forward propagating RF energy and backward propagating RF energy, propagating along the main signal path 251 into the coupled signal path 252. To those of skill in the art it is known that a quarter wave coupler 203 has a property that RF energy entering at the first RF signal port 230a appear at the second RF signal port 203b and a fourth port 203d, but not at a third port 203c. Likewise, energy entering the quarter wave coupler 203 at the second RF port 203b appears at the first RF port 230a and the third port 203c, but not at the fourth port 203d. Thus, the third port 203c provides a signal indicative of backward propagating RF energy and the fourth port 203d provides a signal indicative of forward propagating RF energy.

A first conductor is disposed in series proximate the first RF signal port 203a and a first input port of the CDC 200a. A second conductor is disposed in series proximate the second RF signal port 203b and a second input port of the CDC 200b. A first coupling capacitor 241 is disposed in series between the first input port 200a the coupled signal path and a second coupling capacitor is disposed in series between the second input port 200b the coupled signal path 252. Coupling between the main signal path 251 and the coupled signal path 252 of the quarter wave coupler 203 is achieved using the first coupling capacitor 241 and the second coupling capacitor 242.

A second detector circuit 212, coupled to the third port 203c of the quarter wave coupler circuit 203, is disposed for receiving of the signal indicative of backward-propagating RF energy to form a second intermediate detected signal. A first detector circuit 211, coupled to the fourth port 203d of the quarter wave coupler circuit 203, is disposed for receiving of the signal indicative of forward propagating RF energy to form a first intermediate detected signal. A first difference amplifier 231 is disposed for receiving the first detected signal and a first reference signal emitted from a first reference circuit 213. A second difference amplifier 232 is disposed for receiving the second intermediate detected signal and a second reference signal emitted from a second detector circuit 214. The first difference amplifier 231 has an output port thereof coupled to a first output port 200c for providing a first detected energy output signal, indicative of the forward-propagating RF energy. The second difference amplifier 232 has an output port thereof coupled to a second output port 200d for providing a second detected energy output signal indicative of the backward-propagating RF energy.

Thus, the level of the VSWR is therefore determined by measuring a level of the reflected RF energy as detected by the second detector circuit 212. For a substantial impedance match between the PA output port 220a and the antenna 202, the second detected energy output signal is substantially zero and first detected energy output signal is substantially maximized, otherwise, for an other than substantial impedance match, the second detected energy output signal is substantially other than zero and the first detected energy output signal is substantially other than maximized. The first and second reference circuits provide the first and second reference signals to the first and second difference amplifiers so that offsets are subtracted from the first and second intermediate detected signals. These reference detectors serve to decrease systematic errors and also to decrease pedestals in the first and second detected energy output signals. The first and second difference amplifiers perform a signal subtraction process in order to obtain a measure of the VSWR. Optionally, the first and second difference amplifiers are in the form of operational amplifiers.

Preferably, first and second detector circuits, as well as the first and second reference circuits, are disposed within the CDC 200 along with the regulator circuit 221. Further preferably, the regulator circuit 221 includes a temperature sensing circuit 221a for sensing a temperature of the CDC 200 and for providing a regulated voltage to the quarter wave coupler circuit 203 and to the first and second detector circuits, as well as the first and second reference circuits. The regulated voltage thus provides reduced temperature sensitivity for the CDC 200. Additionally, a first impedance 261 is disposed between the third port 203c and a ground potential and a second impedance 262 is disposed between the fourth port 203d and the ground potential.

The coupled signal path of the quarter wave coupler 203 is manufactured within the CDC 200 as either a distributed quarter wave coupler or lumped quarter wave coupler. The manufacturing technique implemented for manufacturing of this quarter wave coupler is dependent upon the frequency of the RF output signal, integrated circuit process and geometry of the coupler. For lower frequency RF signals the quarter wave coupler is typically implemented using lumped components since a quarter of a wavelength results in a physically large size. For higher frequencies, typically, transmission line or distributed structures are used. Of course, the use of an edge coupler is another possibility. Thus, for lower RF signal frequencies an external main signal path is preferred because of the costs associated with manufacturing of the main signal path on a same substrate as the CDC 200.

Advantageously, the use of an off-chip main signal path 251 and an on-chip coupled signal path 252, as shown in FIG. 2, a lower insertion loss is provided since the quarter wave section of the coupler does not significantly attenuate the signal propagating along the main signal path.

The measuring of the backward propagating RF signal is useful for providing a feedback signal to the transceiver relating to potential VSWR mismatch issues. Optionally, the transceiver modifies the power control loop process or feedback signals for the PA in order to compensate for the VSWR mismatch.

Advantageously, the embodiments of the invention are suitable for use with wireless applications, where accurate RF output signal power detection is preferred and VSWR mismatch is an issue. In particular, wireless local area networks (WLANs) typically require RF amplified signal power detection and are vulnerable to VSWR mismatch. The embodiments of the invention further provide temperature stability and RF amplified signal power detection without phase mismatch problems. Furthermore, a measure of VSWR mismatch is attainable. The embodiments of the invention advantageously offer the aforementioned advantages with a reduced component count.

Numerous other embodiments may be envisaged without departing from the spirit or scope of the invention.

What is claimed is:

1. An integrated circuit for measuring power transfer between a first node and a second node comprising:
    a coupler circuit comprising:
        a first coupler port directly connected to the first node for receiving a RF output signal and a second coupler port directly connected to the second node for providing the RF output signal therefrom, the first coupler port and the second coupler port being electrically coupled, a third coupler port and a fourth coupler port, the fourth coupler port for providing a first signal indicative of forward propagating RF energy propagating from the first coupler port to the second coupler port and the third coupler port for providing a second signal indicative of backwards propagating RF energy propagating from the second coupler port to the first coupler port; and, detection circuitry comprising:
        a first input port coupled to the fourth coupler port for receiving the first signal indicative of forward propagating RF energy;
        a second input port coupled to the third coupler port for receiving the second signal indicative of backwards propagating RF energy;
        a first detected energy output signal port for providing a first detected energy output signal;
        a second detected energy output signal port for providing a second detected energy output signal; and
    wherein the detection circuitry comprises:
        a second detector circuit having an input port for receiving the second signal indicative of backward propagating RF energy and having an output port for providing a second intermediate detected signal in dependence upon the second signal indicative of backward propagating RF energy;
        a second reference circuit having an output port for providing a second reference signal therefrom; and,
        a second difference amplifier circuit having a first input port, a second input port and an output port, the first input port for receiving the second intermediate detected signal, the second input port for receiving the second reference signal and the output port directly connected to the second detected energy output signal port for providing the second detected energy output signal therefrom.

2. A circuit according to claim 1, wherein the detection circuitry comprises a first detector circuit having an input port for receiving the first signal indicative of forward propagating RF energy and having an output port for providing a first intermediate detected signal in dependence upon the first signal indicative of forward propagating RF energy.

3. A circuit according to claim 2, wherein the detection circuitry comprises:
a first reference circuit having an output port for providing a first reference signal therefrom; and,
a first difference amplifier circuit having a first input port, a second input port and an output port, the first input port for receiving the first intermediate detected signal, the second input port for receiving the first reference signal and the output port directly connected to the first detected energy output signal port for providing the first detected energy output signal therefrom.

4. A circuit according to claim 1, comprising a regulator circuit, the regulator circuit for providing a regulated supply voltage to the detection circuitry.

5. A circuit according to claim 1, wherein the coupler circuit comprises a main signal path and a coupled signal path capacitively coupled to the main signal path, the main signal path disposed between the first port and the second port and the coupled signal path disposed between the third port and the fourth port.

6. A circuit according to claim 1, wherein the coupler circuit comprises at least a coupling capacitor disposed between the main signal path and the coupled signal path, the at least a coupling capacitor for coupling of a RF signal propagating along the main signal path to the coupled signal path.

7. A circuit according to claim 5, wherein the main signal path is other than disposed on a same semiconductor substrate as the coupled signal path.

8. A circuit according to claim 5, wherein the main signal path and the coupled signal path are disposed on a same semiconductor substrate.

9. A circuit according to claim 1, comprising a first impedance disposed between the third port and a ground potential.

10. A circuit according to claim 1, comprising a second impedance disposed between the fourth port and a ground potential.

11. A circuit according to claim 1, wherein the coupler circuit comprises a distributed quarter wave coupler circuit.

12. A circuit according to claim 1, wherein the coupler circuit comprises a lumped quarter wave coupler circuit.

13. A circuit according to claim 1, wherein the detection circuitry comprises first and second detectors such that for a substantial impedance match between the first node and the second node, the first detector detected energy output signal is substantially zero and second detector detected energy output signal is substantially maximized.

14. A circuit according to claim 1, wherein the detection circuitry comprises first and second detectors such that for an other than substantial impedance match between the power amplifier circuit and the first load, the first detector detected energy output signal is substantially other than zero and second detector detected energy output signal is substantially other than maximized.

15. A circuit according to claim 1, wherein the circuit is used for wireless applications where the second node is coupled to an antenna for transmitting a wireless RF signal dependent upon the RF output signal.

16. A circuit according to claim 4, wherein the regulator circuit comprises a temperature sensing circuit for sensing a temperature of the circuit and for affecting the regulated supply voltage in dependence thereon.

17. A circuit according to claim 1, wherein the first node comprises an output port of a power amplifier circuit and the second node comprises an input port of a RF antenna.

18. A method of measuring power transfer between a power amplifier circuit for emitting a RF output signal and a first load for receiving the RF output signal comprising the steps of:
providing a coupling circuit having a main signal path and a coupled signal path, the main signal path disposed between the power amplifier circuit and the first load;
propagating a RF output signal along the main signal path to the first load;
coupling forward propagating RF energy and backward propagating RF energy into the coupled signal path;
detecting the forward propagating RF energy to form a first detected energy output signal;
detecting the backward propagating RF energy to form a second detected energy output signal; and,
providing a reference circuit generating a reference signal:
providing a difference amplifier circuit having one input being the reference signal and the second input being the first detected energy output signal wherein the output of the amplifier is a first detected signal relating to the forward propagating RF energy; and
providing a second detected signal relating to the backward propagating RF energy.

19. A method according to claim 18, comprising the step of determining a VSWR of the power transfer in dependence upon the first detected energy output signal and the second detected energy output signal.

20. A method according to claim 18, wherein the coupled signal path is capacitively coupled to the main signal path.

21. A method according to claim 18, wherein the first detected energy output signal and the second detected energy output signal are used by a feedback control circuit for controlling of the PA.

22. A method according to claim 18, wherein for a substantial impedance match between the power amplifier circuit and the first load, the first detected energy output signal is substantially zero and second detected energy output signal is substantially maximized.

23. A method according to claim 18, wherein for an other than substantial impedance match between the power amplifier circuit and the first load, the first detected energy output signal is substantially other than zero and second detected energy output signal is substantially other than maximized.

24. A method according to claim 18, providing a second difference amplifier circuit having one input being the reference signal and the second input being the second detected energy output signal wherein the output of the amplifier is a second detected signal relating to the backward propagating RF energy.

* * * * *